(12) United States Patent
Bailey et al.

(10) Patent No.: US 9,276,560 B2
(45) Date of Patent: Mar. 1, 2016

(54) SYSTEMS AND METHODS FOR FILTER INITIALIZATION AND TUNING

(71) Applicant: LSI Corporation, San Jose, CA (US)

(72) Inventors: James A. Bailey, Snowflake, AZ (US); Robert K. Chen, North Andover, MA (US); Richard T. Kaul, Hudson, WI (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 305 days.

(21) Appl. No.: 14/022,971

(22) Filed: Sep. 10, 2013

(65) Prior Publication Data
US 2014/0012888 A1    Jan. 9, 2014

Related U.S. Application Data

(63) Continuation of application No. 12/889,288, filed on Sep. 23, 2010, now Pat. No. 8,560,589.

(51) Int. Cl.
| | |
|---|---|
| *G06F 17/10* | (2006.01) |
| *H03H 17/02* | (2006.01) |
| *G11B 20/10* | (2006.01) |
| *H03H 11/04* | (2006.01) |

(52) U.S. Cl.
CPC ..... *H03H 17/0248* (2013.01); *G11B 20/10009* (2013.01); *H03H 11/0472* (2013.01); *G11B 20/10027* (2013.01); *G11B 20/10046* (2013.01); *G11B 2220/2516* (2013.01); *H03H 2210/012* (2013.01); *H03H 2210/015* (2013.01); *H03H 2210/021* (2013.01)

(58) Field of Classification Search
CPC .......... H03H 17/0248; H03H 11/0472; G11B 20/10009
USPC .................................................. 708/300–322
See application file for complete search history.

(56) References Cited

U.S. PATENT DOCUMENTS

| | | | |
|---|---|---|---|
| 5,124,593 A | 6/1992 | Michel | |
| 5,982,228 A | 11/1999 | Khorramabadi et al. | |
| 6,112,125 A | 8/2000 | Sandusky | |
| 6,469,856 B1 * | 10/2002 | Mitchell | G11B 20/10009 360/46 |
| 2012/0075011 A1 | 3/2012 | Bailey et al. | |

* cited by examiner

*Primary Examiner* — Tan V. Mai

(57) ABSTRACT

Various embodiments of the present invention provide systems and methods for data filter tuning. As an example, a method for filter tuning is disclosed that includes: providing a tunable filter having an operation filter and a calibration filter; applying a low frequency test input to the operation filter in place of an input signal to yield a first filter output; calculating a low frequency magnitude value corresponding to the first filter output; applying a high frequency test input to the operation filter in place of an input signal to yield a second filter output; calculating a high frequency magnitude value corresponding to the second filter output; modifying a tuning factor of the calibration filter when a ratio of the high frequency magnitude value and the low frequency magnitude value is outside of a defined range; and storing the tuning factor of the calibration filter when the ratio of the high frequency magnitude value and the low frequency magnitude value is within the defined range.

20 Claims, 7 Drawing Sheets

SYSTEMS AND METHODS FOR FILTER INITIALIZATION AND TUNING

CROSS REFERENCE TO RELATED APPLICATIONS

The present application claims priority to (is a continuation of) U.S. patent application Ser. No. 12/889,288 entitled "Systems and Methods for Filter Initialization and Tuning", and filed Sep. 23, 2010 by Bailey et al. The entirety of the aforementioned provisional patent application is incorporated herein by reference for all purposes.

BACKGROUND OF THE INVENTION

The present inventions are related to systems and methods for signal and/or data filtering, and more particularly to systems and methods for tuning a filter.

Various techniques and circuits for filtering data carrying signals have been proposed. For example, filters have been proposed that utilize a filter section modified to provide an oscillator whose natural frequency approximately corresponds to a desired filter cutoff frequency. Such an approach has a variety of drawbacks that limit the achievable performance. As other examples, filters have been developed that utilize master and slave components. Such approaches do not always provide the performance desired as it can be difficult to properly match the master and slave sections.

Hence, for at least the aforementioned reasons, there exists a need in the art for advanced systems and methods for tuning a data filter.

BRIEF SUMMARY OF THE INVENTION

The present inventions are related to systems and methods for signal and/or data filtering, and more particularly to systems and methods for tuning a filter.

Various embodiments of the present invention provide methods for filter tuning. The methods include providing a tunable filter having an operation filter and a calibration filter; applying a low frequency test input to the operation filter in place of an input signal to yield a first filter output; calculating a low frequency magnitude value corresponding to the first filter output; applying a high frequency test input to the operation filter in place of an input signal to yield a second filter output; calculating a high frequency magnitude value corresponding to the second filter output; modifying a tuning factor of the calibration filter when a ratio of the high frequency magnitude value and the low frequency magnitude value is outside of a defined range; and storing the tuning factor of the calibration filter when the ratio of the high frequency magnitude value and the low frequency magnitude value is within the defined range.

Some instances of the aforementioned embodiments further include: amplifying the first filter output using a first gain to yield a first amplified output; amplifying the first filter output using a second gain to yield a second amplified output; determining the second amplified output as using more of a range of an analog to digital converter circuit; selecting the second gain as a filter gain value; performing an analog to digital conversion on the first amplified output to yield a first series of digital samples; and performing an analog to digital conversion on the second amplified output to yield a second series of digital samples. In such instances, the low frequency magnitude value is calculated using both the first series of digital samples and the second series of digital samples. In some such instances, the methods further include storing the second gain. In some cases, calculating the low frequency magnitude value corresponding to the first filter output includes: calculating a first discrete Fourier transform value using the first series of digital samples; calculating a second discrete Fourier transform value using the second series of digital samples; calculating a first magnitude squared value equal to the sum of the square of the real and imaginary parts of the first discrete Fourier transform value; calculating a second magnitude squared value equal to the sum of the square of the real and imaginary parts of the second discrete Fourier transform value; and summing the first magnitude squared value and the second magnitude squared value to yield the low frequency magnitude value.

In one or more instances of the aforementioned embodiments, the methods further include: amplifying the first filter output using a first gain to yield a first amplified output; amplifying the first filter output using a second gain to yield a second amplified output; performing an analog to digital conversion on the first amplified output to yield a first series of digital samples; performing an analog to digital conversion on the second amplified output to yield a second series of digital samples. In such instances, the high frequency magnitude value is calculated using both the first series of digital samples and the second series of digital samples. In some cases, calculating the high frequency magnitude value corresponding to the first filter output includes: calculating a first discrete Fourier transform value using the first series of digital samples; calculating a second discrete Fourier transform value using the second series of digital samples; calculating a first magnitude squared value equal to the sum of the square of the real and imaginary parts of the first discrete Fourier transform value; calculating a second magnitude squared value equal to the sum of the square of the real and imaginary parts of the second discrete Fourier transform value; and summing the first magnitude squared value and the second magnitude squared value to yield the high frequency magnitude value.

In one or more instances of the aforementioned embodiments, the methods further include performing an analog to digital conversion on the first filter output to yield a first series of digital samples such that the low frequency magnitude value is calculated using the first series of digital samples; and performing an analog to digital conversion on the second filter output to yield a second series of digital samples, such that the high frequency magnitude value is calculated using the second series of digital samples. In some cases, calculating the low frequency magnitude value corresponding to the first filter output includes: calculating a discrete Fourier transform value using the first series of digital samples; and calculating a magnitude squared value equal to the sum of the square of the real and imaginary parts of the discrete Fourier transform value.

Other embodiments of the present invention provide methods for selecting a cutoff frequency in a tunable filter circuit. The methods include: providing a tunable filter circuit initialized to include a first set of tuning values corresponding to a first cutoff frequency and a second set of tuning values corresponding to a second cutoff frequency; receiving a request to operate the tunable filter circuit at a requested cutoff frequency; and programming the tunable filter circuit to operate at the requested cutoff frequency using at least one of the first set of tuning values and the second set of tuning values. In some instances, the requested cutoff frequency is equal to the first cutoff frequency, and programming the tunable filter circuit to operate at the requested cutoff frequency uses the first set of tuning values. In various instances, the requested cutoff frequency is greater than the first cutoff frequency and less than the second cutoff frequency, and programming the tunable filter circuit to operate at the requested cutoff frequency includes performing a linear interpolation to calculate a third set of tuning values corresponding to a distance between the requested cutoff frequency and the first cutoff frequency and a distance between the requested cutoff frequency and the second cutoff frequency. In such instances, programming the tunable filter circuit to operate at the requested cutoff frequency uses the third set of tuning values.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

Figure 1:
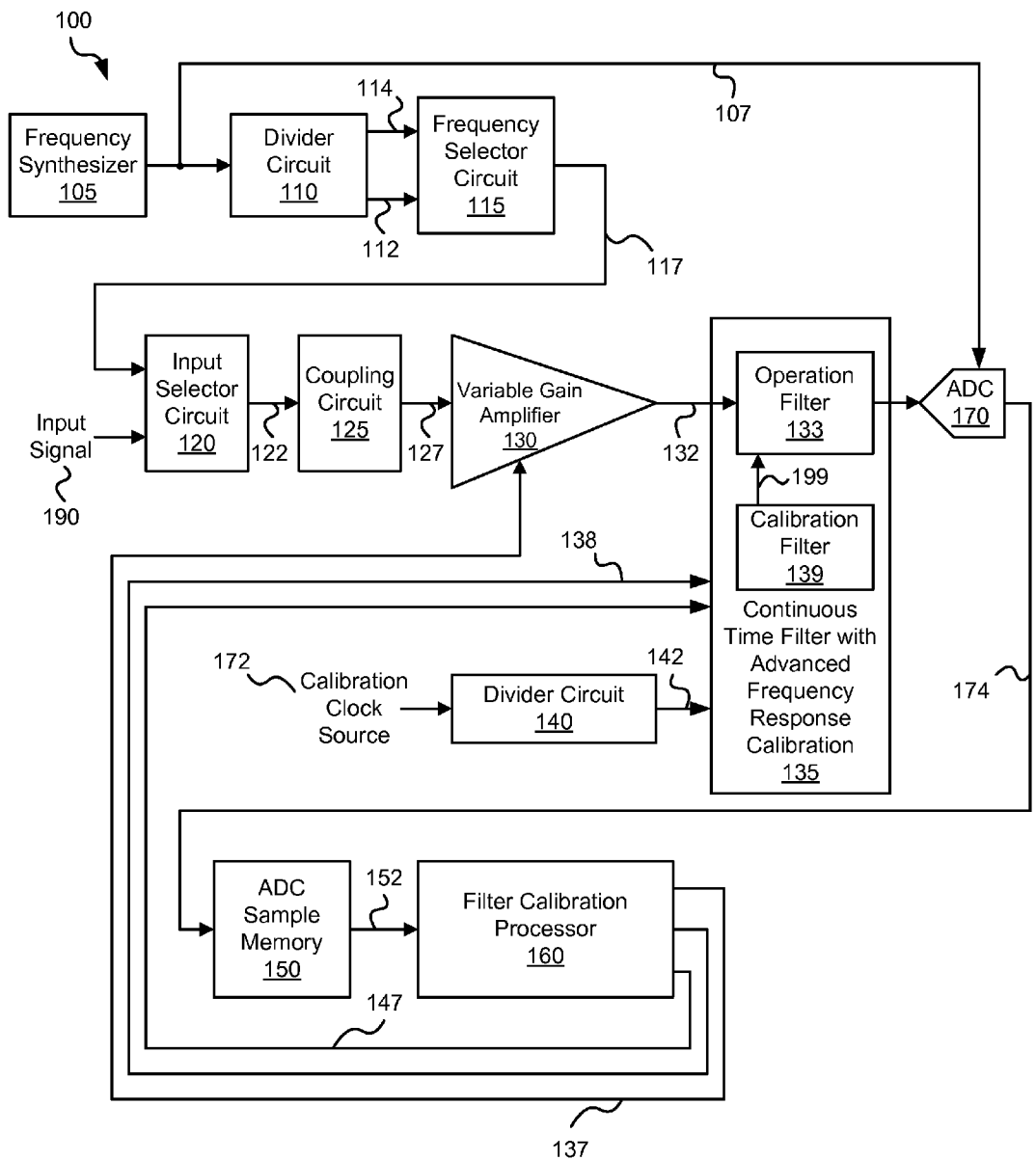
FIG. 1 is a block diagram of a tunable filter system in accordance with one or more embodiments of the present invention.

The present inventions are related to systems and methods for signal and/or data filtering, and more particularly to systems and methods for tuning a filter.

One or more embodiments of the present invention provide an approach to continuous time filter calibration that includes performing an initial calibration algorithm utilizing two test signal inputs in place of a standard data input to generate a variety of samples. A discrete Fourier transform (DFT) value is calculated for a desired gain at a low frequency, and another discrete Fourier transform value is calculated for the desired gain at a higher frequency (e.g., a desired cutoff or 3 dB frequency). This initialization process is used to calculate tuning values for one or more cutoff frequencies that are stored to a memory by a calibration processor. The stored tuning values may be retrieved from the memory when operation of the filter system is requested at a desired cutoff frequency. In some cases, where tuning values for the desired cutoff frequency are not available in the memory, a linear interpolation of tuning values for a frequency higher than the requested cutoff frequency and a frequency lower than the requested cutoff frequency may be used to yield tuning values corresponding to the requested cutoff frequency through linear interpolation.

In some cases, the aforementioned approach provides for measuring the frequency response of the operation filter, and calibrates or tunes the operation filter using an accurate frequency reference applied to a calibration filter. In operation, filter tuning values are applied to the operation filter to maintain accurate control of the operation filter response over environmental variations. In some cases, the initial calibration uses the signal path without modification except for the injection of a test signal in place of a standard data signal input, thus providing accurate correlation between the initialization or calibration mode and the actual signal processing mode supported by the filter. In some cases, the calibration or tuning process incorporates feedback and/or changes to all elements in the signal path, rather than just a single filter section. This additional degree of freedom improves the accuracy of the frequency tuning process.

In some embodiments, the aforementioned filter tuning is applied to a filter that includes a calibration or tracking circuit that includes a copy of a subset of an operation filter which is performing the actual filtering (i.e., includes a copy of one of the biquadratic filter sections in the actual signal path). This calibration circuit continuously monitors operation and adjusts the filter bandwidth and Q factor to obtain optimal operation. In some cases, such a calibration/operation relationship provides for an advantageous filter accuracy and stable filter frequency response. Based upon the disclosure provided herein, one of ordinary skill in the art will recognize a variety of other advantages that may be achieved either in addition to or in place of the aforementioned advantages.

Turning to FIG. 1, a block diagram of a tunable filter system 100 is shown in accordance with one or more embodiments of the present invention. Tunable filter system 100 includes a frequency synthesizer circuit 105 that is operable to provide a clock output 107 running at a selected frequency. In one embodiment of the present invention, frequency synthesizer circuit 105 may be programmed to operate at a variety of different frequencies allowing for utilization of tunable filter system at different selectable frequencies. Frequency synthesizer circuit 105 may be any circuit known in the art that is capable of providing an output signal operating at a selected frequency. Clock output 107 is provided to a divider circuit 110 that divides clock output 107 into two separate clock outputs 112, 114 operating at a lower frequency than clock output 107. In particular, clock output 112 is clock output 107 divided by sixty-four, and clock output 114 is clock output 107 divided by sixteen. It should be noted that divided circuit 110 may be designed to provide other division outputs depending upon the particular implementation.

Where clock output 112 is a divide by sixty-four clock and clock output 114 is a divide by sixteen clock, frequency synthesizer circuit 105 may be programmed to generate output clock 107 as four times a desired 3 dB frequency (i.e., 4*3 dB frequency). In this case, clock output 112 is the desired 3 dB frequency divided by sixteen (i.e., [3 dB frequency]/16), and clock output 114 is the desired 3 dB frequency (i.e., cutoff frequency).

Clock output 112 and clock output 114 are provided to a frequency selector circuit 115 that selects one of clock output 112 or clock output 114 to be provided as a test signal 117 to an input selector circuit 120. Frequency selector circuit 115 may be any circuit known in the art that is capable of providing an output selected from two or more inputs. In one particular embodiment of the present invention, frequency selector circuit 115 is a digital multiplexer circuit. Similarly, input selector circuit 120 is operable to select between an input signal 190 and test signal 117 to be provided as an output 122 to a coupling circuit 125. Input signal 190 may be any analog signal including data to be processed. In one embodiment of the present invention, input signal 190 is derived from a read/write head assembly disposed in relation to a magnetic storage medium. In another embodiment of the present invention, input signal 190 is derived from a receive channel of a wireless communication device. Based upon the disclosure provided herein, one of ordinary skill in the art will recognize a variety of sources of input signal 190 that may be supported using different embodiments of the present invention.

Coupling circuit 125 performs some analog signal processing on output 122, and may be done by any analog processing circuit known in the art that is capable of performing the desired analog signal processing. An analog output 127 is provided to a variable gain amplifier 130 from coupling circuit 125. Variable gain amplifier 130 amplifies analog output 127 to yield an amplified output 132 that is provided to a continuous time filter 135. The amount of gain applied by variable gain amplifier circuit 130 is adjusted based on a gain adjustment value 137.

Continuous time filter 135 includes an operation filter 133 and a calibration filter 139. Operation filter 133 is the filter used to perform filtering on the received data stream in accordance with settings calibrated by calibration filter 139. In operation, calibration filter 139 in combination with operation filter 133 are calibrated during an initialization phase for one or more desired cutoff frequencies. The calibration includes adjusting the Q factor of both calibration filter 139 and operation filter 133, and adjusting the gain applied by variable gain amplifier 130 as more fully discussed below. Calibration filter 139 operates using a clock source 142. Clock source 142 is generated from a calibration clock source 172 passed through a divider circuit 140. In some embodiments, calibration clock source 172 is received from a crystal oscillator circuit as is known in the art. Divider circuit 140 generates a square wave signal through the division process, and the square wave signal is provided as clock source 142. Based upon the disclosure provided herein, one of ordinary skill in the art will recognize a variety of calibration clock sources and/or clock generation circuits that may be used in relation to different embodiments of the present invention.

In some embodiments of the present invention, calibration filter 139 is a phase-lock copy block that is initialized before a cutoff frequency calibration (e.g., the calibration described in FIG. 3 below) is performed. This copy block includes a biquadratic (hereinafter "biquad") portion that is a copy of a biquad portion of operational filter 133. This copy biquad portion of calibration filter 139 can be used to tune for a particular cutoff frequency (i.e., Q tuning) and gain. To do this tuning, an oscillator providing a square wave signal source (e.g., calibration clock source 172 and divider circuit 140 in combination) input 142 to the copy biquad portion of calibration filter 139. In calibration filter 139, the input to the biquad portion and the output from the biquad portion are phase compared and adjusted using a filter tuning value until the phase of the output lags the phase of the input by ninety degrees. Such a phase shift corresponds to the tuned cutoff frequency of the biquad filter portion.

The output of operation filter 133 is provided to an analog to digital converter circuit 170 that provides a series of digital samples 174 to an analog to digital converter sample memory 150. Analog to digital converter circuit 170 may be any circuit known in the art that is capable of providing a series of digital samples corresponding to an analog input. Sample memory 150 may be any circuit known in the art that is capable of storing one or more digital samples provided by analog to digital converter circuit 170. The values of samples stored in analog to digital converter sample memory 150 are provided as a memory output 152 to a filter calibration processor circuit 160. Filter calibration processor circuit 160 calculates both a gain adjustment value 137, a Q factor adjustment value 147, and a cutoff frequency adjustment value 138.

In operation, filter calibration processor circuit 160 controls an initialization phase where clock output 112 is selected as test input 117, and test input 117 is provided as the output of input selector circuit 120. As this initialization process begins, an initial value is provided as Q factor adjustment value 147. In this configuration, filter calibration processor circuit 160 incrementally modifies gain adjustment value 137 until the maximum samples received from sample memory 150 approximately equal the maximum output range of analog to digital converter circuit 170 without saturating analog to digital converter circuit 170. Once gain adjustment value 137 results in the desired output from analog to digital converter circuit 170, the value of gain adjustment value 137 is stored to a cutoff frequency adjustment value memory that is maintained as part of calibration filter 139 for use whenever the frequency corresponding to clock output 114 is selected as the cutoff frequency of continuous time filter 135. The cutoff frequency adjustment value memory of calibration filter 139 is arranged such that whenever a desired cutoff frequency is selected for filter 135, the values corresponding to gain adjustment value 137 and Q factor adjustment value 147 are pulled from the memory and provided as adjustment factors to operation filter 133.

Once the aforementioned gain adjustment process is completed, filter calibration processor circuit 160 calculates a DFT value (e.g., a DFT value for a single frequency) using samples from sample memory 150 that correspond to each of (N+1) values of gain adjustment value 137. Filter calibration processor circuit 160 calculates a magnitude squared value that is equal to the sum of the square of the real and imaginary parts of the calculated DFT value for each gain setting. The low frequency magnitude of the filter is defined as the sum of the magnitude squared calculations across the (N+1) gain settings.

Next, filter calibration processor circuit 160 selects clock output 114 as test input 117, and test input 117 is provided as the output of input selector circuit 120. Using this test input, samples from analog to digital converter circuit 170 corresponding to the same (N+1) values of gain adjustment value 137 used in the previously calculations are stored to sample memory 150. Filter calibration processor circuit 160 calculates a magnitude squared value that is equal to the sum of the square of the real and imaginary parts of the calculated DFT value for each of the gain settings. The high frequency magnitude of the filter is defined as the sum of the magnitude squared calculations across the (N+1) gain settings.

Next, a ratio of the high frequency value divided by the low frequency value is compared to a preset ratio value. Where the ratio is approximately equal to the preset ratio value, the current value of cutoff frequency adjustment value 138 is stored to the cutoff frequency adjustment value memory that is maintained as part of calibration filter 139. Again, the cutoff frequency adjustment value memory of calibration filter 139 is arranged such that whenever a desired cutoff frequency is selected for filter 135, the values corresponding to gain adjustment value 137 and cutoff frequency adjustment value 138 are pulled from the memory and provided as adjustment factors to operation filter 133.

Calibration filter 139 continuously updates a tuning vector 199 that is provided to operation filter 133. Tuning vector 199 is sensitive to any environmental changes occurring in the circuit in which tunable filter system 100 is implemented. As environmental changes occur, the transconductance of calibration filter 139 changes. This change in transconductance is provided as tuning vector 199 in the form of a cutoff frequency adjustment value.

Figure 2:
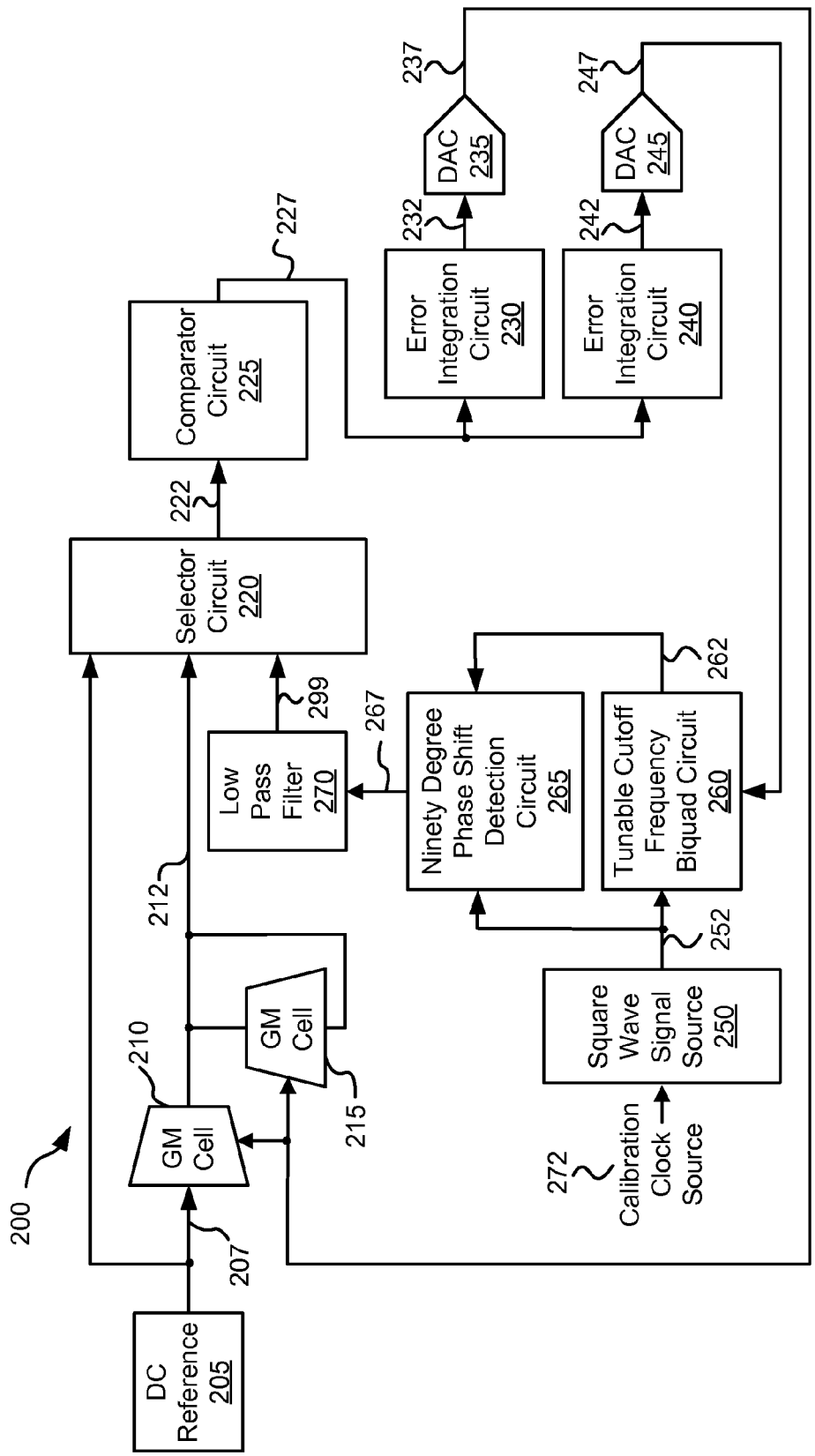
FIG. 2 depicts a tunable filter section in accordance with various embodiments of the present invention that may be used as a calibration portion of tunable filter system of FIG. 1.

Turning to FIG. 2, a tunable filter 200 is depicted in accordance with various embodiments of the present invention. In some cases, tunable filter 200 may be used in place of calibration filter 139 and used to establish cutoff frequency and Q tuning factors that are then applied to operation filter 133 as discussed above in relation to FIG. 1. Tunable filter 200 includes a DC reference source 205 that may be any circuit or device known in the art that is capable of providing one or more static voltage values as an output 207. Output 207 is provided to both a selector circuit 220 and as an input to a transconductance (GM) cell 210. An output from transconductance cell 210 is tied to an output of a transconductance cell 215 to yield a common output 212 that is provided to selector circuit 220. In addition, common output 212 is provided as an input to transconductance cell 215. The gain input of each of transconductance cell 210 and transconductance cell 215 is tied to a gain adjustment value 237.

Selector circuit 220 may be any circuit known in the art that is capable of passing a selected one or a pair of signals as an output 222 to a comparator circuit 225. In operation, selector circuit 220 passes both common output 212 and output 207 to comparator 225 as output 222. Comparator 225 compares output 207 and common output 212 yielding a digital value 227 that is provided to an error integrator circuit 230 and an error integrator circuit 240.

Where output 207 is less than or equal to output 212, digital value 227 is a logic '0' resulting in a decrementing of an output 232 from error integration circuit 230. In this case, gain adjustment value 237 is output 232 processed through digital to analog converter 235 and will decrease due to digital value 227 being zero. Where, on the other hand, output 207 is greater than output 212, digital value 227 may be a logic '1'. In this case, error integration circuit 230 increases the value provided as output 232 to digital to analog converter 235. In turn, the value of gain adjustment value 237 is changed resulting in a change to the gain applied on transconductance cells 210, 215. This process is repeated until the desired gain adjustment value 237 is provided (i.e., a gain adjustment value 237 that results in output 207 that is approximately equal to output 212).

Once gain adjustment value 237 is established as described above, a cutoff frequency adjustment value 247 is determined. Initially, error integration circuit 240 includes a default value that is provided as an output 242 to a digital to analog converter 245, and selector circuit 220 provides an output 299 as output 222 to comparator circuit 225. Digital to analog converter 245 creates an analog representation of output 242 and provides it as cutoff frequency adjustment value 247 to a tunable cutoff frequency biquad circuit 260. In turn, tunable cutoff frequency biquad circuit 260 filters an input signal 252 derived by generating a square wave from a calibration clock source 272. Tunable cutoff frequency biquad circuit 260 may be any high Q active filter known in the art and offering the capability of tuning the Q factor based on a Q factor adjustment input. As an example, tunable cutoff frequency biquad circuit 260 may be implemented similar to that disclosed in U.S. Pat. No. 6,404,276 entitled "integrated filter tuning method and apparatus" filed by Liu and issued Jun. 11, 2002. The entirety of the aforementioned application is incorporated herein by reference for all purposes. Based upon the disclosure provided herein, one of ordinary skill in the art will recognize a variety of circuits that may be used to perform the functions of tunable cutoff frequency biquad circuit 260. Tunable cutoff frequency biquad circuit 260 provides a filtered output 262. Of note, the tuning process of the cutoff frequency is not sensitive to change in Q.

A square wave signal source circuit 250 is used to generate input signal 252 from calibration clock source 272. In one embodiment of the present invention, square wave signal source circuit 250 is a divider circuit operable to divide calibration clock source 272 by a factor of two or more and thereby generate a clock signal output that is substantially a square wave. Based on the disclosure provided herein, one of ordinary skill in the art will recognize a variety of circuits that may be used in place of square wave signal source circuit 250 to provide a substantially square wave to tunable cutoff frequency biquad circuit 260.

Input signal 252 and filtered output 262 are provided as inputs to a ninety degree phase shift detection circuit 265. Ninety degree phase shift detection circuit 265 operates such that a phase detection output 267 is zero when input signal 252 leads filtered output 262 by ninety degrees, and is non-zero with a sign and magnitude corresponding to the difference in phase between input signal 252 and filtered output 262. In one particular embodiment of the present invention, ninety degree phase shift detection circuit 265 is implemented as a mixer circuit in accordance with the following equation:

Output 267=(Input Signal 252)sin($\omega t$)*(Filtered Output 262)sin($\omega t+\phi$).

Using trigometric identities, the above mentioned equation for output 267 reduces as follows:

$$\text{Output 267} = \frac{(\text{Input Signal 252}) * (\text{Filtered Output 262})}{2} \begin{bmatrix} \cos(\omega t - \omega t - \varphi) - \\ \cos(2\omega t + \varphi) \end{bmatrix}.$$

From this, it can be shown that output 267 reduces to a time dependent term and a DC term in accordance with the following equation:

$$\text{Output 267} = \frac{(\text{Input Signal 252}) * (\text{Filtered Output 262})}{2} [\cos(\varphi)] - \frac{(\text{Input Signal 252}) * (\text{Filtered Output 262})}{2} \cos(2\omega t + \varphi)].$$

Output 267 is provided to a low pass filter circuit 270 that is designed to attenuate the time dependent portion. Low pass filter circuit 270 may be any circuit known in the art that is capable of attenuating higher frequency elements of a signal, while leaving lower frequency portions of the signal (e.g., the DC term) substantially unchanged. Low pass filter 270 provides an output 272 in accordance with the following equation:

$$\text{Output 272} = \frac{(\text{Input Signal 252}) * (\text{Filtered Output 262})}{2}[\cos(\varphi)].$$

Output 272 is provided by selector circuit as output 272 to comparator circuit 225. Comparator circuit 225 compares output 222 with zero, and provides the result of the comparison as digital value 227 to error integrator circuit 230 and error integrator circuit 240. Error integrator circuit 240 adds digital value 227 to a prior error integration value maintained in error integration circuit 240, and provides the result as output 242 to digital to analog converter 245. Digital to analog converter value 245 provides an analog signal representing output 242 as utoff frequency adjustment value 247 to tunable cutoff frequency biquad circuit 260. Ultimately, where tunable cutoff frequency biquad circuit 260 provides filtered output 262 that lags signal input 252 by approximately ninety degrees (i.e., output 272 is approximately zero), tunable filter 200 is considered tuned. At this juncture, the determined values of gain adjustment value 237 and utoff frequency adjustment value 247 are provided to an operation filter that mimics the operation of tunable filter 200 and operates in the signal path.

Figure 3A:
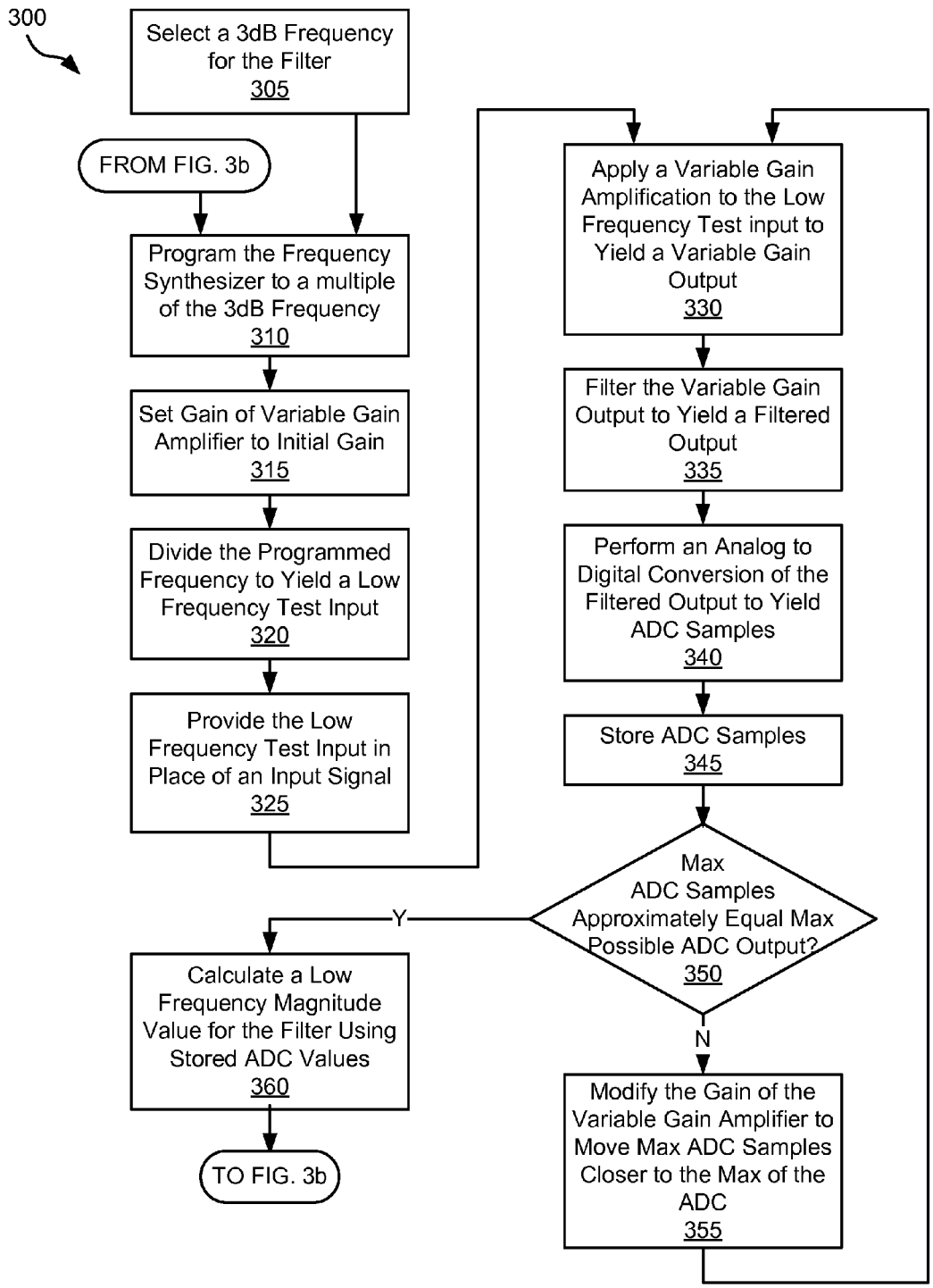
FIGS. 3a-3b are flow diagrams showing a method for initializing a data filter in accordance with some embodiments of the present invention.
Figure 3B:
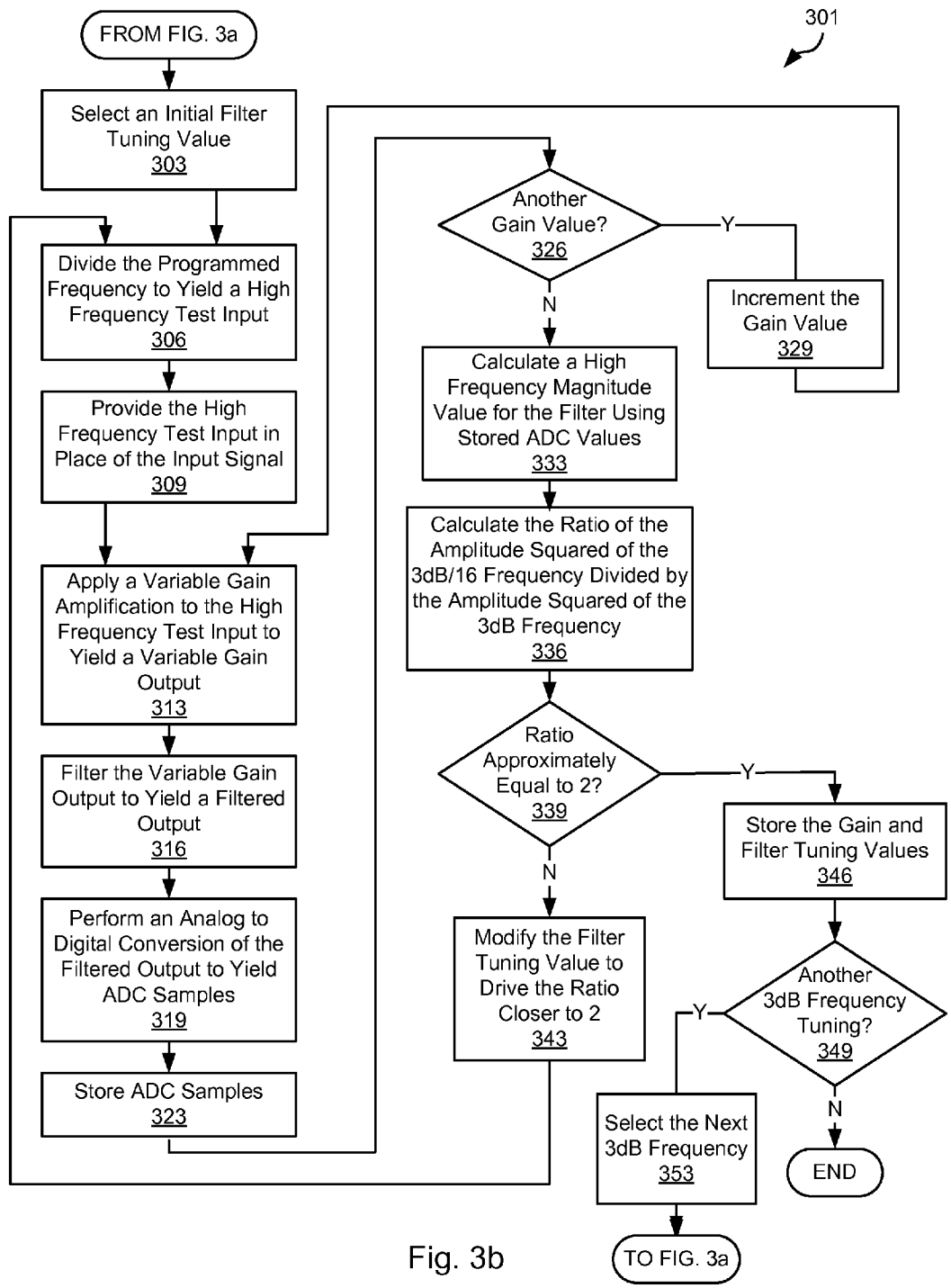

Turning to FIGS. 3a-3b, together a flow diagram 300 and a flow diagram 301 show a method for initializing a data filter in accordance with some embodiments of the present invention. Following flow diagram 300, a cutoff frequency (e.g., 3 dB frequency) is selected for a tunable filter (block 305). In some cases, selecting the cutoff frequency may include programming a selected frequency value into a value select register. A frequency synthesizer is programmed to operate at a multiple of the selected cutoff frequency (block 310). In one particular embodiment of the present invention, the frequency synthesizer is programmed to operate at four times the selected cutoff frequency. Based upon the disclosure provided herein, one of ordinary skill in the art will recognize a variety of multiples of a selected cutoff frequency that may be used in relation to different embodiments of the present invention.

In addition, the gain of a variable gain amplifier is set to an initial or default gain value in preparation for tuning the filter (block 315). In some case, this initial gain value is stored in a register or other system memory. The synthesizer frequency (block 310) is divided by an amount to yield a low frequency test input (block 320). In one embodiment of the present invention, the low frequency test input is the cutoff frequency divided by sixteen. Thus, where the synthesizer is programmed to operate at four times the cutoff frequency (block 310), the synthesizer frequency is divided by sixty-four to yield the example low frequency test input of the cutoff frequency divided by sixteen. Based on the disclosure provided herein, one of ordinary skill in the art will recognize a variety of low frequency test inputs that may be used in relation to different embodiments of the present invention.

The low frequency test signal is provided in place of a standard data signal as the input to the filter system (block 325). As such, the filter system operates on the low frequency test signal as if it was a received input signal. A variable gain amplification is applied to the low frequency test input to yield a variable gain output (block 330). The gain applied corresponds to a gain adjustment value which at the outset is an initial or default value (block 315). As more fully described in relation to subsequent blocks, the gain adjustment value is modified until the desired gain of the variable gain amplification is achieved.

The result of the variable gain amplification is filtered to yield a filtered output (block 335). This filtering is performed by a tunable filter circuit that will be tuned for the selected cutoff frequency as described in relation to later blocks. The filtered output is converted from the analog signal domain to the digital signal domain using an analog to digital converter (block 340). This analog to digital conversion yields a number of digital samples (i.e., ADC samples) that represent the received filtered output. The resulting digital samples are stored to a memory for use in determining tuning parameters for the filter (block 345).

It is determined whether the stored digital samples include samples that are approximately equal to the maximum possible output of the analog to digital converter without saturating the analog to digital converter (block 350). Where the stored samples represent a range that is less than the range of the analog to digital converter (block 350), the gain applied to the variable gain amplifier is modified to increase the gain such that the range of the analog to digital converter is more fully utilized (block 355). The processes of blocks 330 through 350 are repeated until a gain value is identified that causes the entire range of the analog to digital converter to be used (block 350).

Once the stored digital samples include samples that are approximately equal to the maximum possible output of the analog to digital converter (i.e., the desired gain value has been identified) (block 350), the stored digital samples are used to calculate low frequency magnitude value for the filter corresponding to the low frequency test input (block 360). This includes calculating a discrete Fourier transform (DFT) of the samples for each of the gain values that were applied to the variable gain amplifier. Then, a magnitude squared value is calculated that is equal to the sum of the magnitude squared of the real and imaginary parts for each of the aforementioned discrete Fourier transform values. From this, a low frequency magnitude value for the filter is calculated as the sum of the magnitude squared calculations for each of the incremental gain values applied to the variable gain amplifier. The following pseudocode represents the aforementioned calculation process:

```
Initialize low frequency magnitude value equal to zero;
For (i=initial gain value to i=final gain value)
{
    calculate DFT value for gain of i;
    square the real part of the DFT value;
    square the imaginary part of the DFT value;
    sum the square of the real part and the square of the imaginary part.
    store the sum of the squares value for the gain of i;
    low frequency magnitude value += sum of squares value for the gain
    of i; and i++
}
```

Following flow diagram 301 of FIG. 3b, an initial filter tuning value is selected (block 303). In some cases, selecting the initial filter tuning value may include programming a selected tuning value into a value select register, or pulling a tuning value from a hardwired area of the system. Based upon the disclosure provided herein, one of ordinary skill in the art will recognize a variety of initial filter tuning values and/or approaches for applying such tuning values to the circuit that may be used in relation to different embodiments of the present invention.

The synthesizer frequency (block 310) is divided by an amount to yield a high frequency test input (block 306). In one embodiment of the present invention, the high frequency test input is the cutoff frequency. Thus, where the synthesizer is programmed to operate at four times the cutoff frequency (block 310), the synthesizer frequency is divided by four to yield the example high frequency test input. Based on the disclosure provided herein, one of ordinary skill in the art will recognize a variety of high frequency test inputs that may be used in relation to different embodiments of the present invention.

The high frequency test signal is provided in place of the standard data signal as the input to the filter system (block 309). As such, the filter system operates on the high frequency test signal as if it was a received input signal. A variable gain amplification is applied to the high frequency test input to yield a variable gain output (block 313). The initial gain value is the same as the initial gain value applied in block 330, and as more fully described below is incremented through the same gain values applied by block 330 in determining the appropriate gain for the filter system.

The result of the variable gain amplification is filtered to yield a filtered output (block 316). This filtering is performed by a tunable filter circuit that will be tuned for the selected cutoff frequency as described in relation to later blocks. The filtered output is converted from the analog signal domain to the digital signal domain using an analog to digital converter (block 319). This analog to digital conversion yields a number of digital samples (i.e., ADC samples) that represent the received filtered output. The resulting digital samples are stored to a memory for use in determining tuning parameters for the filter (block 323). The process of amplifying, filtering and converting is repeated for the gain values that were used in relation to block 330 each time causing a number of digital samples to be stored to memory (blocks 326, 329).

Once digital samples for each of the gain values have been obtained (block 329), the stored digital samples are used to calculate a high frequency magnitude value for the filter corresponding to the high frequency test input (block 333). This includes calculating a discrete Fourier transform (DFT) for a single frequency of the samples for each of the gain values that were applied to the variable gain amplifier. Then, a magnitude squared value is calculated that is equal to the sum of the magnitude squared of the real and imaginary parts for each of the aforementioned discrete Fourier transform values. From this, a low frequency magnitude value for the filter is calculated as the sum of the magnitude squared calculations for each of the incremental gain values applied to the variable gain amplifier. The following pseudocode represents the aforementioned calculation process:

---
Initialize high frequency magnitude value equal to zero;
For (i=initial gain value to i=final gain value)
{
    calculate DFT value for gain of i;
    square the real part of the DFT value;
    square the imaginary part of the DFT value;
    sum the square of the real part and the square of the imaginary part.
    store the sum of the squares value for the gain of i;
    high frequency magnitude value += sum of squares value for the gain of i; and i++
}
---

The ratio of the high frequency magnitude value derived from block 333 to the low frequency magnitude value derived from block 360 is calculated in accordance with the following equation (block 336):

$$\text{Ratio} = \frac{\text{High Frequency Magnitude Value}}{\text{Low Frequency Magnitude Value}}.$$

It is then determined whether the ratio is approximately equal to '2' (block 339). In some embodiments of the present invention, approximately equal to '2' is between 1.9 and 2.1. In other embodiments of the present invention, approximately equal to '2' is between 1.95 and 2.05. Based upon the disclosure provided herein, one of ordinary skill in the art will recognize a variety of ranges that may satisfy the requirement of approximately equal to '2' depending upon the accuracy desired and/or other design constraints of the particular implementation. Where the ratio is not approximately equal to '2' (block 339), the filter tuning value is modified to drive the ratio closer to '2' (block 343). With this new filter tuning value (block 343), the processes of blocks 306 through 339 are repeated.

Otherwise, where the ratio is approximately equal to '2' (block 339), the gain value identified in block 350 as utilizing the range of the analog to digital converter and the filter tuning value resulting in the ratio of approximately '2' are stored to memory for use in programming the filter system when the selected cutoff frequency is requested (block 346). It is then determined whether there is another cutoff frequency to be calibrated (block 349). Where another cutoff frequency is to be calibrated (block 353), the next frequency is selected for the filter (block 305), and the preceding processes are repeated resulting in storage of a gain value and a filter tuning value corresponding to the next selected cutoff frequency. This process repeats for one or more cutoff frequencies depending upon the particular implementation.

Figure 4:
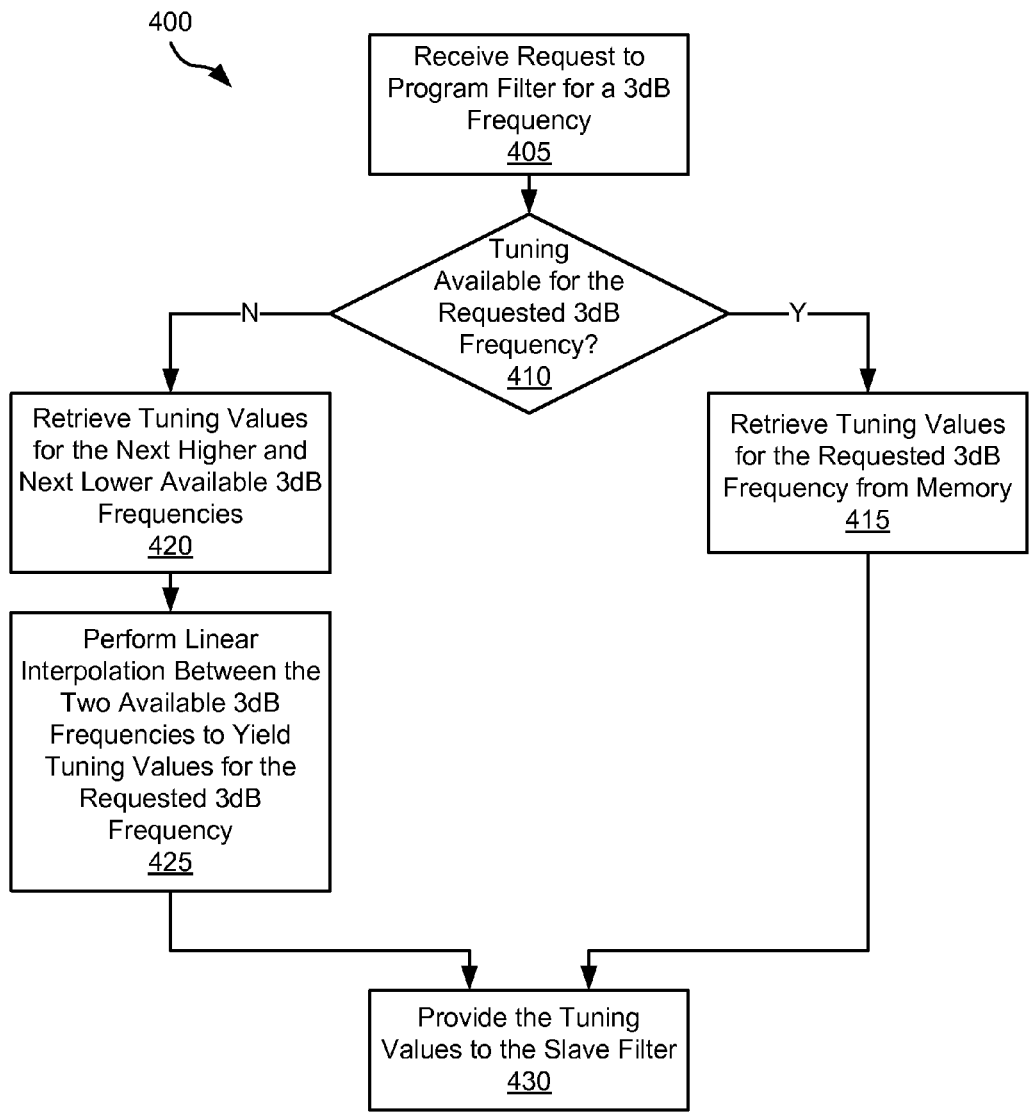
FIG. 4 is a flow diagram showing a method for tuning a data filter in accordance with various embodiments of the present invention.

Turning to FIG. 4, a flow diagram 400 shows a method for tuning a data filter in accordance with various embodiments of the present invention. Following flow diagram 400, a request to program a filter for a particular cutoff frequency is received (block 405). Such a request may be received, for example, by writing a cutoff frequency value to a register. Based upon the disclosure provided herein, one of ordinary skill in the art will recognize a variety of ways in which the cutoff frequency may be selected and programmed.

It is determined whether tuning values (i.e., gain and filter tuning values) are available for the selected cutoff frequency (block 410). Where tuning values are available for the selected cutoff frequency (block 410), those tuning values are retrieved from memory (block 415) and applied to the filter system resulting in operation at the selected cutoff frequency (block 430). Otherwise, where tuning values are not available for the selected cutoff frequency (block 420), tuning values for an available frequency below the selected cutoff frequency and tuning values for an available frequency above the selected cutoff frequency are retrieved from memory (block 420). A linear interpolation using the retrieved sets of tuning values is performed to calculate tuning values for the requested cutoff frequency (block 425). The calculated tuning values are then applied to the filter system resulting in operation at the selected cutoff frequency (block 430).

Figure 5:
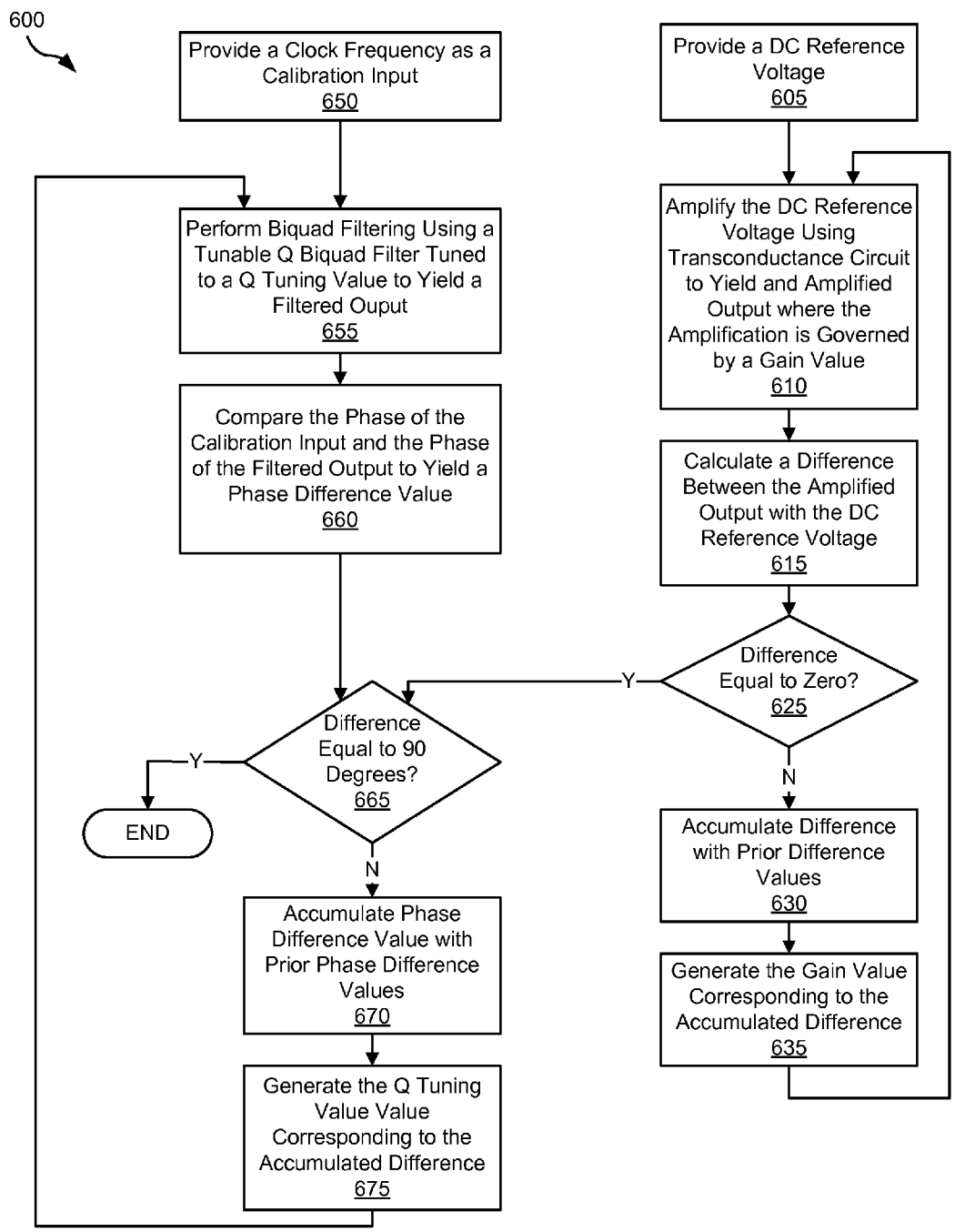
FIG. 5 depicts a method in accordance with one or more embodiments of the present invention for tuning a biquad filter.

Turning to FIG. 5, a flow diagram 600 depicts a method in accordance with one or more embodiments of the present invention for tuning a biquad filter. Following flow diagram 600, a DC reference voltage is provided to a transconductance circuit (block 605). The transconductance circuit amplifies the received DC reference voltage to provide an amplified output (block 610). The gain of the amplified output is controlled by a gain value. A difference between the amplified output and the DC reference voltage is calculated (block 615).

It is then determined whether the calculated difference is approximately equal to zero (block 625). Where a difference remains (block 625), the calculated difference is accumulated with prior calculated differences (block 630), and the gain value corresponding to the accumulated difference is generated (block 635). The processes of blocks 605 through 635 are repeated until the difference between the amplified output and the DC reference voltage is approximately zero.

In addition, a clock frequency is provided as a calibration input to a tunable Q biquad filter (block 650). The biquad filter filters the received calibration input and provides a corresponding filtered output (block 655). The applied filtering is controlled by a Q tuning value. A phase difference between the filtered output and the calibration input is calculated (block 660), and it is determined whether the phase difference is approximately equal to ninety-degrees (block 665).

Where the gain value has been tuned such that the difference between the amplified output and the DC reference voltage is approximately zero (block 625) and the phase difference is approximately equal to ninety-degrees (block 665), the circuit is considered tuned. Otherwise, the newly calculated phase difference value is accumulated with prior phase difference values (bock 670), and the Q tuning value corresponding to the accumulated difference is generated (block 675). The processes of blocks 655 through 675 are repeated until the phase difference between the calibration input and the filtered output is approximately equal to ninety-degrees.

Figure 6:
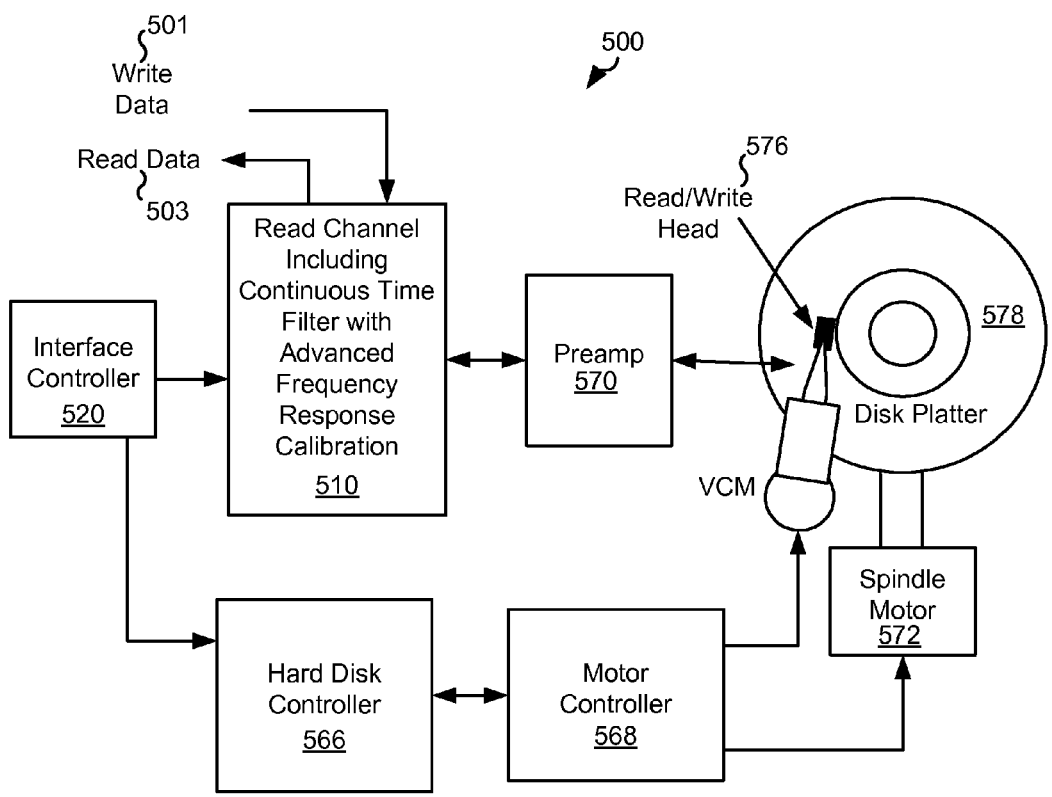
FIG. 6 shows a storage system including a read channel circuit with a continuous time filter having advanced frequency response calibration in accordance with some embodiments of the present invention.

Turning to FIG. 6, a storage system 500 including a read channel circuit 510 with interim state sequence detecting is shown in accordance with various embodiments of the present invention. Storage system 500 may be, for example, a hard disk drive. Storage system 500 also includes a preamplifier 570, an interface controller 520, a hard disk controller 566, a motor controller 568, a spindle motor 572, a disk platter 578, and a read/write head 576. Interface controller 520 controls addressing and timing of data to/from disk platter 578. The data on disk platter 578 consists of groups of magnetic signals that may be detected by read/write head assembly 576 when the assembly is properly positioned over disk platter 578. In one embodiment, disk platter 578 includes magnetic signals recorded in accordance with either a longitudinal or a perpendicular recording scheme.

In a typical read operation, read/write head assembly 576 is accurately positioned by motor controller 568 over a desired data track on disk platter 578. Motor controller 568 both positions read/write head assembly 576 in relation to disk platter 578 and drives spindle motor 572 by moving read/write head assembly to the proper data track on disk platter 578 under the direction of hard disk controller 566. Spindle motor 572 spins disk platter 578 at a determined spin rate (RPMs). Once read/write head assembly 578 is positioned adjacent the proper data track, magnetic signals representing data on disk platter 578 are sensed by read/write head assembly 576 as disk platter 578 is rotated by spindle motor 572. The sensed magnetic signals are provided as a continuous, minute analog signal representative of the magnetic data on disk platter 578. This minute analog signal is transferred from read/write head assembly 576 to read channel circuit 510 via preamplifier 570. Preamplifier 570 is operable to amplify the minute analog signals accessed from disk platter 578. In turn, read channel circuit 510 decodes and digitizes the received analog signal to recreate the information originally written to disk platter 578. This data is provided as read data 503 to a receiving circuit. As part of decoding the received information, read channel circuit 510 filters the received data. Such filtering may be done using a filter similar to that described above in relation to FIGS. 1-2. Further, the filter may be initialized and/or tuned using the methods described in relation to FIGS. 3-4 above. A write operation is substantially the opposite of the preceding read operation with write data 501 being provided to read channel circuit 510. This data is then encoded and written to disk platter 578.

It should be noted that storage system 500 may be integrated into a larger storage system such as, for example, a RAID (redundant array of inexpensive disks or redundant array of independent disks) based storage system. It should also be noted that various functions or blocks of storage system 500 may be implemented in either software or firmware, while other functions or blocks are implemented in hardware.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for filtering data. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A method for selecting a cutoff frequency in a tunable filter circuit, the method comprising:
   providing a tunable filter circuit initialized to include a first set of tuning values corresponding to a first cutoff frequency and a second set of tuning values corresponding to a second cutoff frequency;
   receiving a request to operate the tunable filter circuit at a requested cutoff frequency; and
   programming the tunable filter circuit to operate at the requested cutoff frequency using at least one of the first set of tuning values and the second set of tuning values.

2. The method of claim 1, wherein the requested cutoff frequency is equal to the first cutoff frequency, and wherein programming the tunable filter circuit to operate at the requested cutoff frequency uses the first set of tuning values.

3. The method of claim 1, wherein the requested cutoff frequency is greater than the first cutoff frequency and less than the second cutoff frequency, and wherein programming the tunable filter circuit to operate at the requested cutoff frequency includes:
   performing a linear interpolation to calculate a third set of tuning values corresponding to a distance between the requested cutoff frequency and the first cutoff frequency and a distance between the requested cutoff frequency and the second cutoff frequency; and wherein programming the tunable filter circuit to operate at the requested cutoff frequency uses the third set of tuning values.

4. The method of claim 1, wherein the method further comprises:

performing an initialization of the tunable filter circuit, wherein the initialization yields the first set of tuning values and the second set of tuning values.

5. The method of claim 4, wherein the initialization includes:

applying a low frequency test input to an operation filter included in the tunable filter circuit in place of an input signal to yield a first filter output;

calculating a low frequency magnitude value corresponding to the first filter output;

applying a high frequency test input to the operation filter in place of an input signal to yield a second filter output;

calculating a high frequency magnitude value corresponding to the second filter output;

modifying a tuning factor of a calibration filter included in the tunable filter circuit when a ratio of the high frequency magnitude value and the low frequency magnitude value is outside of a defined range; and storing the tuning factor as part of the first set of tuning values when the ratio of the high frequency magnitude value and the low frequency magnitude value is within the defined range.

6. The method of claim 5, wherein the method further comprises:

amplifying the first filter output using a first gain to yield a first amplified output;

amplifying the first filter output using a second gain to yield a second amplified output;

determining the second amplified output as using more of a range of an analog to digital converter circuit;

selecting the second gain as a filter gain value;

performing an analog to digital conversion on the first amplified output to yield a first series of digital samples;

performing an analog to digital conversion on the second amplified output to yield a second series of digital samples; and wherein the low frequency magnitude value is calculated using both the first series of digital samples and the second series of digital samples.

7. The method of claim 6, wherein calculating the low frequency magnitude value corresponding to the first filter output includes:

calculating a first discrete Fourier transform value using the first series of digital samples;

calculating a second discrete Fourier transform value using the second series of digital samples;

calculating a first magnitude squared value equal to the sum of the square of the real and imaginary parts of the first discrete Fourier transform value;

calculating a second magnitude squared value equal to the sum of the square of the real and imaginary parts of the second discrete Fourier transform value; and summing the first magnitude squared value and the second magnitude squared value to yield the low frequency magnitude value.

8. A method for selecting a cutoff frequency in a tunable filter circuit, the method comprising:

initializing a tunable filter circuit with a first set of tuning values corresponding to a first cutoff frequency;

initializing the tunable filter circuit with a second set of tuning values corresponding to a second cutoff frequency; and programming the tunable filter circuit to operate at a requested cutoff frequency using at least one of the first set of tuning values and the second set of tuning values.

9. The method of claim 8, wherein the method further comprises:

receiving a request to operate the tunable filter circuit at the requested cutoff frequency.

10. The method of claim 8, wherein the requested cutoff frequency is equal to the first cutoff frequency, and wherein programming the tunable filter circuit to operate at the requested cutoff frequency uses the first set of tuning values.

11. The method of claim 8, wherein the requested cutoff frequency is greater than the first cutoff frequency and less than the second cutoff frequency, and wherein programming the tunable filter circuit to operate at the requested cutoff frequency includes:

performing a linear interpolation to calculate a third set of tuning values corresponding to a distance between the requested cutoff frequency and the first cutoff frequency and a distance between the requested cutoff frequency and the second cutoff frequency; and wherein programming the tunable filter circuit to operate at the requested cutoff frequency uses the third set of tuning values.

12. The method of claim 8, wherein the method further comprises:

performing an initialization of the tunable filter circuit, wherein the initialization yields the first set of tuning values and the second set of tuning values.

13. The method of claim 12, wherein the initialization includes:

applying a first frequency test input to an operation filter included in the tunable filter circuit in place of an input signal to yield a first filter output;

calculating a first frequency magnitude value corresponding to the first filter output;

applying a second frequency test input to the operation filter in place of an input signal to yield a second filter output, wherein the second frequency test input exhibits a frequency higher than that of the first frequency test input;

calculating a second frequency magnitude value corresponding to the second filter output;

modifying a tuning factor of a calibration filter included in the tunable filter circuit when a ratio of the second frequency magnitude value and the first frequency magnitude value is outside of a defined range; and storing the tuning factor as part of the first set of tuning values when the ratio of the second frequency magnitude value and the first frequency magnitude value is within the defined range.

14. The method of claim 13, wherein the method further comprises:

amplifying the first filter output using a first gain to yield a first amplified output;

amplifying the first filter output using a second gain to yield a second amplified output;

determining the second amplified output as using more of a range of an analog to digital converter circuit;

selecting the second gain as a filter gain value;

performing an analog to digital conversion on the first amplified output to yield a first series of digital samples;

performing an analog to digital conversion on the second amplified output to yield a second series of digital samples; and wherein the first frequency magnitude value is calculated using both the first series of digital samples and the second series of digital samples.

15. The method of claim 14, wherein calculating the first frequency magnitude value corresponding to the first filter output includes:

calculating a first discrete Fourier transform value using the first series of digital samples;

calculating a second discrete Fourier transform value using the second series of digital samples;

calculating a first magnitude squared value equal to the sum of the square of the real and imaginary parts of the first discrete Fourier transform value;

calculating a second magnitude squared value equal to the sum of the square of the real and imaginary parts of the second discrete Fourier transform value; and summing the first magnitude squared value and the second magnitude squared value to yield the low frequency magnitude value.

16. A method for selecting a cutoff frequency in a tunable filter circuit, the method comprising:

determining a first set of tuning values corresponding to a first cutoff frequency of a tunable filter circuit;

determining a second set of tuning values corresponding to a second cutoff frequency of the tunable filter circuit;

initializing a tunable filter circuit with a first set of tuning values corresponding to a first cutoff frequency;

receiving a request to operate the tunable filter circuit at a requested cutoff frequency; and programming the tunable filter circuit to operate at the requested cutoff frequency using at least one of the first set of tuning values and the second set of tuning values.

17. The method of claim 16, wherein determining a first set of tuning values and determining the second set of tuning values comprises:

applying a first frequency test input to an operation filter included in the tunable filter circuit in place of an input signal to yield a first filter output;

calculating a first frequency magnitude value corresponding to the first filter output;

applying a second frequency test input to the operation filter in place of an input signal to yield a second filter output, wherein the second frequency test input exhibits a frequency higher than that of the first frequency test input;

calculating a second frequency magnitude value corresponding to the second filter output;

modifying a tuning factor of a calibration filter included in the tunable filter circuit when a ratio of the second frequency magnitude value and the first frequency magnitude value is outside of a defined range; and storing the tuning factor as part of the first set of tuning values when the ratio of the second frequency magnitude value and the first frequency magnitude value is within the defined range.

18. The method of claim 17, wherein the method further comprises:

amplifying the first filter output using a first gain to yield a first amplified output;

amplifying the first filter output using a second gain to yield a second amplified output;

determining the second amplified output as using more of a range of an analog to digital converter circuit;

selecting the second gain as a filter gain value;

performing an analog to digital conversion on the first amplified output to yield a first series of digital samples;

performing an analog to digital conversion on the second amplified output to yield a second series of digital samples; and wherein the low frequency magnitude value is calculated using both the first series of digital samples and the second series of digital samples.

19. The method of claim 18, wherein calculating the first frequency magnitude value corresponding to the first filter output includes:

calculating a first discrete Fourier transform value using the first series of digital samples;

calculating a second discrete Fourier transform value using the second series of digital samples;

calculating a first magnitude squared value equal to the sum of the square of the real and imaginary parts of the first discrete Fourier transform value;

calculating a second magnitude squared value equal to the sum of the square of the real and imaginary parts of the second discrete Fourier transform value; and summing the first magnitude squared value and the second magnitude squared value to yield the first frequency magnitude value.

20. The method of claim 16, wherein the requested cutoff frequency is greater than the first cutoff frequency and less than the second cutoff frequency, and wherein programming the tunable filter circuit to operate at the requested cutoff frequency includes:

performing a linear interpolation to calculate a third set of tuning values corresponding to a distance between the requested cutoff frequency and the first cutoff frequency and a distance between the requested cutoff frequency and the second cutoff frequency; and wherein programming the tunable filter circuit to operate at the requested cutoff frequency uses the third set of tuning values.

* * * * *